United States Patent
Chen et al.

(10) Patent No.: US 7,675,285 B2
(45) Date of Patent: Mar. 9, 2010

(54) SENSOR AND METHOD INCLUDING NOISE COMPENSATION

(75) Inventors: Weihua Chen, Westford, MA (US); Saeed Shafiyan-Rad, Nashua, NH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 1182 days.

(21) Appl. No.: 10/936,935

(22) Filed: Sep. 9, 2004

(65) Prior Publication Data
US 2006/0061351 A1    Mar. 23, 2006

(51) Int. Cl.
*G01B 7/14* (2006.01)
(52) U.S. Cl. .................................. 324/207.26
(58) Field of Classification Search ............. 324/207.26
See application file for complete search history.

(56) References Cited
U.S. PATENT DOCUMENTS

| | | | | |
|---|---|---|---|---|
| 4,323,847 A | * | 4/1982 | Karbowski | 324/327 |
| 4,678,994 A | * | 7/1987 | Davies | 324/236 |
| 4,723,110 A | * | 2/1988 | Voorman | 330/252 |
| 4,875,009 A | * | 10/1989 | Leveque | 324/207.13 |
| 5,568,854 A | * | 10/1996 | Hayes et al. | 194/318 |
| 5,952,822 A | * | 9/1999 | Kayserman et al. | 324/207.12 |
| 6,545,614 B1 | * | 4/2003 | Kasai | 341/33 |
| 6,617,845 B1 | | 9/2003 | Shafiyan-Rad et al. | 324/207.16 |
| 6,984,979 B1 | * | 1/2006 | Edel | 324/253 |
| 7,274,189 B2 | * | 9/2007 | Chen et al. | 324/207.26 |
| 2006/0049827 A1 | | 3/2006 | Chen | |

* cited by examiner

*Primary Examiner*—Reena Aurora
(74) *Attorney, Agent, or Firm*—Schwegman Lundberg LLP; William R. Walbrun

(57) ABSTRACT

An apparatus includes a sense element and an oscillator. The oscillator is coupled to the sense element and is used to generate an oscillator signal and a gain control signal. The oscillator signal is amplitude compensated when noise is detected in the sense element. A method includes detecting magnetic interference in a sense element coupled to an oscillator, and adjusting a gain control signal in the oscillator to compensate for the magnetic interference.

21 Claims, 7 Drawing Sheets

SENSOR AND METHOD INCLUDING NOISE COMPENSATION

TECHNICAL FIELD

Sensors for use in detecting targets, and more particularly, sensors for use in detecting targets in the presence of an alternating current magnetic field.

TECHNICAL BACKGROUND

Sensors, such as proximity sensors, are used in industrial machinery, such as welding equipment and industrial robots. Proximity sensors detect the presence of material objects, such as metal targets. Proximity sensors are used to detect the presence of both stationary and non-stationary targets. A table for holding a work piece to be welded, such as an engine block, is an example of a stationary target. To detect a table a proximity sensor is moved toward the table until the table is detected. A moving robotic arm, such as a robotic arm moving a work piece, such as an engine block, onto a table is an example of a non-stationary target. A moving robotic arm is detected as it moves to a position near a proximity sensor.

Unfortunately, some environments in which proximity sensors are used are electromagnetically noisy environments. For example, sensors are used in environments that include arc welders. Arc welders create a electromagnetically noisy environment. Some sensors fail when used in such an electromagnetically noisy environment. A failed sensor can cause manufacturing lines to shut down or industrial machinery to malfunction. For these and other reasons there is a need for sensors that do not fail in the presence of a magnetic field.

SUMMARY

An apparatus is provided including a sense element and an oscillator coupled to the sense element. The oscillator generates an oscillator signal and a gain control signal. Several options of the apparatus are provided. In one option, the oscillator amplitude compensates the oscillator signal when noise is detected in the sense element. In another option, the noise has a frequency of about sixty hertz. In another option, the oscillator comprises a filter coupled to a transconductance amplifier. In another option, the filter receives the oscillator signal at a filter input port and provides the gain control signal at a filter output port. In another option, the filter comprises a highpass filter. In another option, the highpass filter has a cutoff frequency and the oscillator signal has a frequency below the cutoff frequency. In another option, the transconductance amplifier includes a gain port, the filter includes a filter output port, and the filter output port is coupled to the gain input port. In another option, the sense element includes a coil including a magnetic core. The magnetic core comprises a ferromagnetic material.

A method is provided that includes detecting a frequency shift in an oscillator signal and compensating for an amplitude change in the oscillator signal in response to the frequency shift. Several options of the method are provided. In one option, detecting a frequency shift in the oscillator signal includes processing the oscillator signal with a highpass filter. In another option, compensating for the amplitude change in the oscillator signal in response to the frequency shift includes adjusting a gain control signal provided to a transconductance amplifier.

Another method is provided that includes detecting magnetic interference in a sense element coupled to an oscillator and adjusting a gain control signal in the oscillator to compensate for the magnetic interference. Several options of the method are provided. In one option, detecting magnetic interference in the sense element coupled to an oscillator includes detecting a frequency shift in an oscillator signal. In another option, adjusting the gain control signal in the oscillator to compensate for the magnetic interference includes passing an oscillator signal through a filter to adjust the gain control signal.

A system is provided that includes a sense element, an oscillator coupled to the sense element, and a target to be detected by the sense element. Several options are provided. In one option, the oscillator generates an oscillator signal and a gain control signal and the oscillator amplitude compensates the oscillator signal when noise is detected in the sense element and a target is detected by the sense element. In another option, the target comprises a moveable structure to be detected by the sense element. In still another option, the moveable structure includes a welding unit. In another option, the target comprises a stationary structure to be detected by the sense element. In another option, the stationary structure comprises an arc welding unit.

These and other embodiments, aspects, advantages, and features will be set forth in part in the description which follows, and in part will become apparent to those skilled in the art by reference to the following description and referenced drawings or by practice thereof. The aspects, advantages, and features are realized and attained by means of the instrumentalities, procedures, and combinations particularly pointed out in the appended claims and their equivalents.

DESCRIPTION OF THE EMBODIMENTS

In the following detailed description, reference is made to the accompanying drawings, which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural changes may be made without departing from the spirit and scope of the present invention. Therefore, the following detailed description is not to be taken in a limiting sense, and the scope is defined by the appended claims.

Figure 1A:
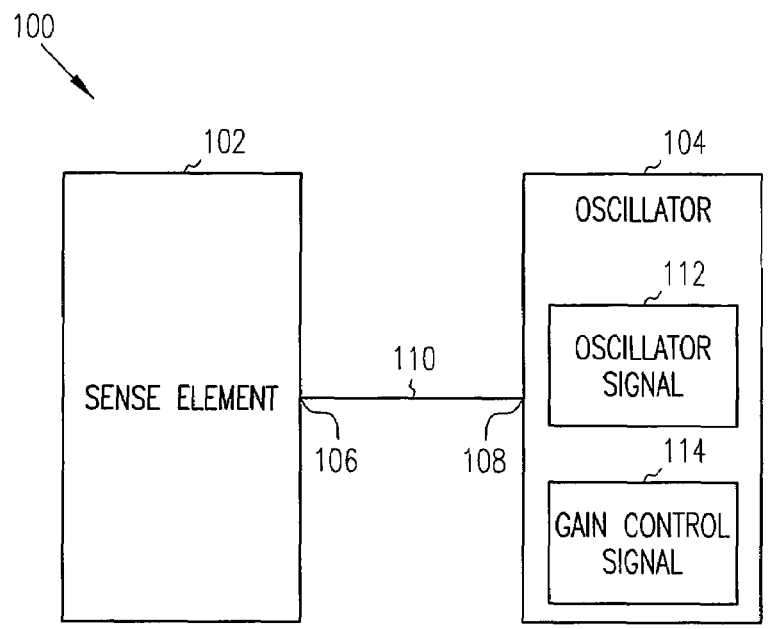
FIG. 1A illustrates a block diagram of an apparatus including a sense element and an oscillator coupled to the sense element in accordance with one embodiment.

FIG. 1A illustrates a block diagram of an apparatus 100 including a sense element 102 and an oscillator 104 coupled to the sense element 102 in accordance with one embodiment. The sense element 102 has a sense element port 106. The oscillator 104 has an oscillator port 108. The sense element port 106 is coupled to the oscillator port 108. The coupling provides a channel 110 for sending signals, such as electronic signals, between the sense element 102 and the oscillator 104. The oscillator 104 includes an oscillator signal 112 and a gain control signal 114.

Figure 1B:
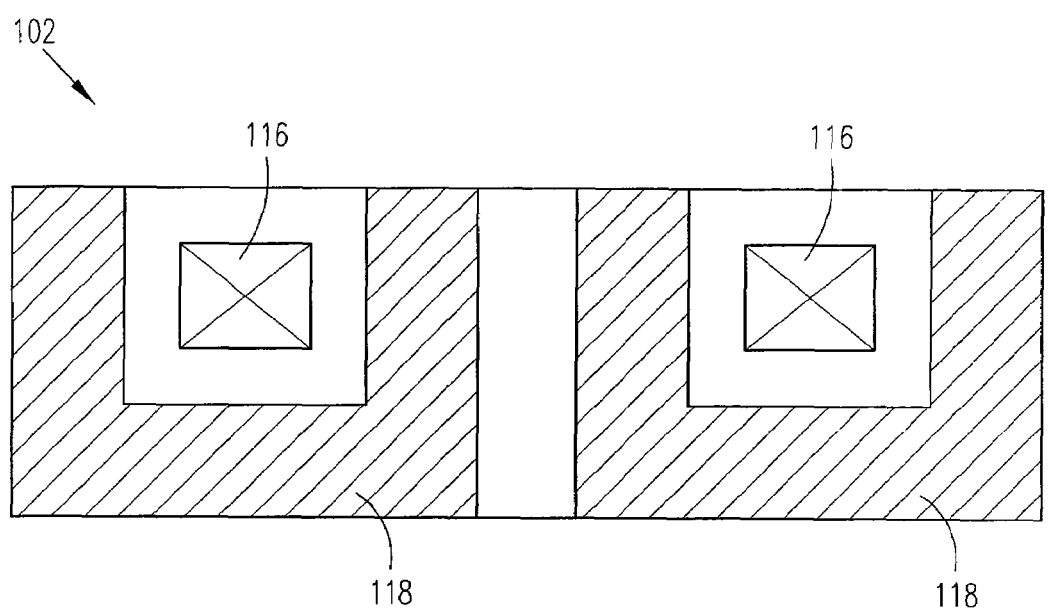
FIG. 1B illustrates the sense element, shown in FIG. 1A, including a coil and a magnetic core in accordance with one embodiment.

FIG. 1B illustrates the sense element 102, shown in FIG. 1A, including a coil 116 and a magnetic core 118 in accordance with one embodiment. A conductive material, such as a metal or polysilicon, is suitable for use in the fabrication of the coil 116. Copper is an exemplary metal suitable for use in the fabrication of the coil 116. In some embodiments, the coil 116 is a discrete coil. In some embodiments, the coil 116 is an integrated circuit coil and fabricated on a die. An integrated circuit coil is a coil fabricated with the same processes, such as the processes used to form the integrated circuits coupled to the coil, and on the same die as the integrated circuits coupled to the coil. A die is a substrate, such as a semiconductor substrate. Exemplary semiconductor materials suitable for use in forming a die in connection with the fabrication of the coil 116 include silicon, germanium, and gallium arsenide. Ferrite, a ferromagnetic material, is an exemplary material suitable for use in connection with the fabrication of the magnetic core 118. Ferrite is suitable for use as a core material for a discrete coil or for an integrated circuit coil.

Referring again to FIG. 1A, in operation, the oscillator 104 generates the oscillator signal 112. The oscillator signal 112 is a substantially periodic signal. The sense element 102 senses the presence of a target. A metal plate is an exemplary target suitable for use in connection with the apparatus 100. In the presence of a target, an electrical property, such as the resistive loss, of the sense element 102 changes. A change in an electrical property of the sense element 102 produces a change in the oscillator signal 112. Detection of a change in the oscillator signal 112 indicates the presence of the target. The oscillator 104 generates the gain control signal 114. Although the oscillator signal 112 is a substantially periodic signal, the gain control signal 114 is not limited to being a substantially periodic signal. The gain control signal 114 amplitude compensates the oscillator signal 112 when noise, such as magnetic noise produced by an arc welder, is present at the sense element 102.

Figure 2:
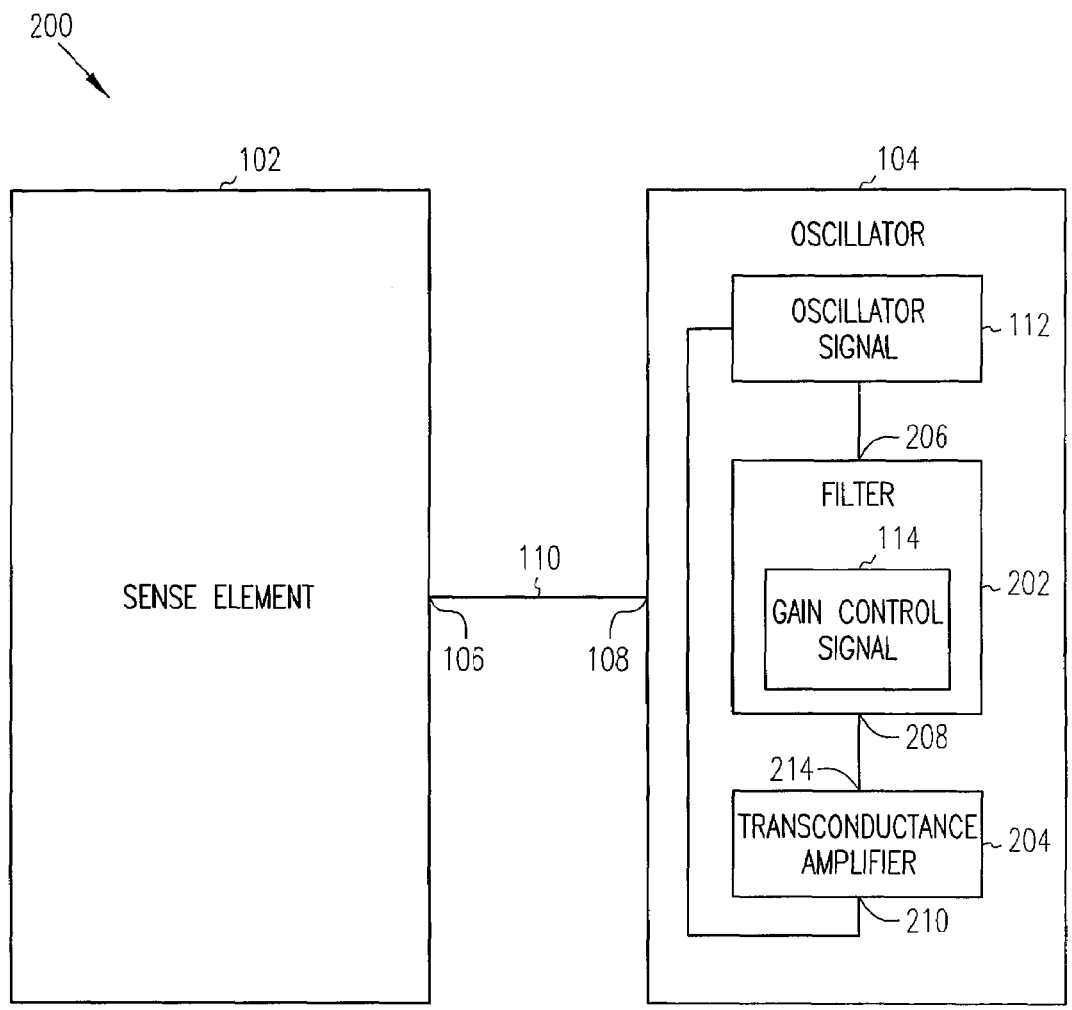
FIG. 2 illustrates a block diagram of an apparatus including the sense element, the oscillator, the oscillator signal, and the gain control signal, all shown in FIG. 1A, and a filter to receive the oscillator signal and to provide the gain control signal to a transconductance amplifier in accordance with one embodiment.

FIG. 2 illustrates a block diagram of an apparatus 200 including the sense element 102, the oscillator 104, the oscillator signal 112, and the gain control signal 114, all shown in FIG. 1A, and a filter 202 to receive the oscillator signal 112 and to provide the gain control signal 114 to a transconductance amplifier 204 in accordance with one embodiment. The sense element 102 has a sense element port 106. The oscillator 104 has an oscillator port 108. The sense element port 106 of the sense element 102 is coupled to the oscillator port 108 of the oscillator 104. The coupling provides a channel 110 for sending signals, such as electronic signals, between the sense element 102 and the oscillator 104.

The oscillator 104 includes the filter 202 coupled to the transconductance amplifier 204. The filter includes a filter input port 206 and a filter output port 208. The filter 202 receives the oscillator signal 112 at the filter input port 206 and provides the gain control signal 114 at the filter output port 208. In some embodiments, the filter 202 includes a highpass filter. A highpass filter is a filter which attenuates frequencies below its cutoff frequency. For the filter 202 having a highpass transfer function and a cutoff frequency, the oscillator signal 112 has a frequency below the cutoff frequency.

The transconductance amplifier 204 converts a voltage to a current. The transconductance amplifier 204 includes an amplifier output port 210. The amplifier output port is coupled to the oscillator port 108. The transconductance amplifier 204 includes a gain control input port 214. The filter output port 208 is coupled to the gain control input port 214.

In operation, the oscillator 104 generates the oscillator signal 112 and the gain control signal 114. The oscillator signal 112 is a substantially periodic signal. In some embodiments, the oscillator signal 112 is processed to form the gain control signal 114. The oscillator 104 amplitude compensates the oscillator signal 112 when noise is detected in the sense element 102. Amplitude compensation provided by the oscillator 104 adjusts the amplitude of the oscillator signal 112. For example, if the amplitude of the oscillator signal 112 decreases, then amplitude compensation increases (boosts) the amplitude of the oscillator signal 112. If the amplitude of the oscillator signal 112 increases, then amplitude compensation decreases (suppresses) the amplitude of the oscillator signal 112. In some embodiments, amplitude compensation is triggered when noise is present at the sense element 102. In some embodiments, the noise that triggers amplitude compensation has a frequency of about sixty hertz.

Figure 3:
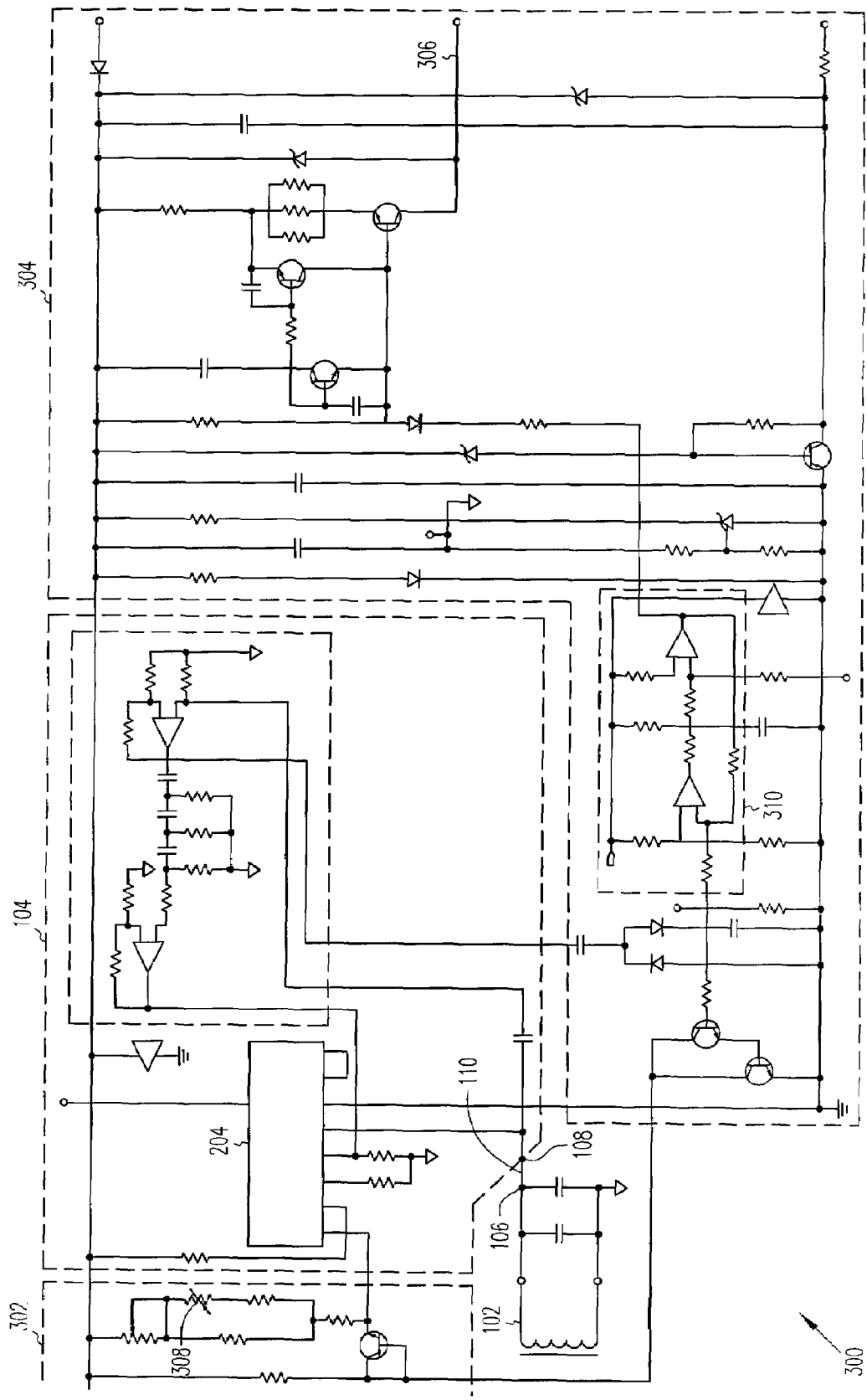
FIG. 3 illustrates a schematic diagram of an apparatus including the sense element, shown in FIG. 2, the oscillator, shown in FIG. 2, and a bias circuit, an interface circuit, and a sense element output port in accordance with one embodiment.

FIG. 3 illustrates a schematic diagram of an apparatus 300 including the sense element 102, shown in FIG. 2, the oscillator 104, shown in FIG. 2, and a bias circuit 302, an interface circuit 304, and an apparatus output port 306 in accordance with one embodiment. The channel 110 couples the sense element port 106 of the sense element 102 to the oscillator port 108 of the oscillator 104.

The bias circuit 302 provides a bias current to the transconductance amplifier 204, shown in FIG. 2. The bias circuit 302 is not limited to a particular topology. In some embodiments, the bias circuit 302 includes an adjustable impedance 308. In some embodiments, the bias circuit 302 is coupled to the interface circuit 304. In some embodiments, the bias circuit 302 is coupled to a Schmitt trigger 310 included in the interface circuit 304. A Schmitt trigger includes a comparator that switches an output signal when an input signal passes in one direction through a reference voltage.

The interface circuit 304 receives and processes the oscillator signal 112, shown in FIG. 2, to provide a target detected signal at the apparatus output port 306. In some embodiments, interface circuit 304 includes the Schmitt trigger circuit 310. In some embodiments, the target detected signal is a current signal.

Figure 4:
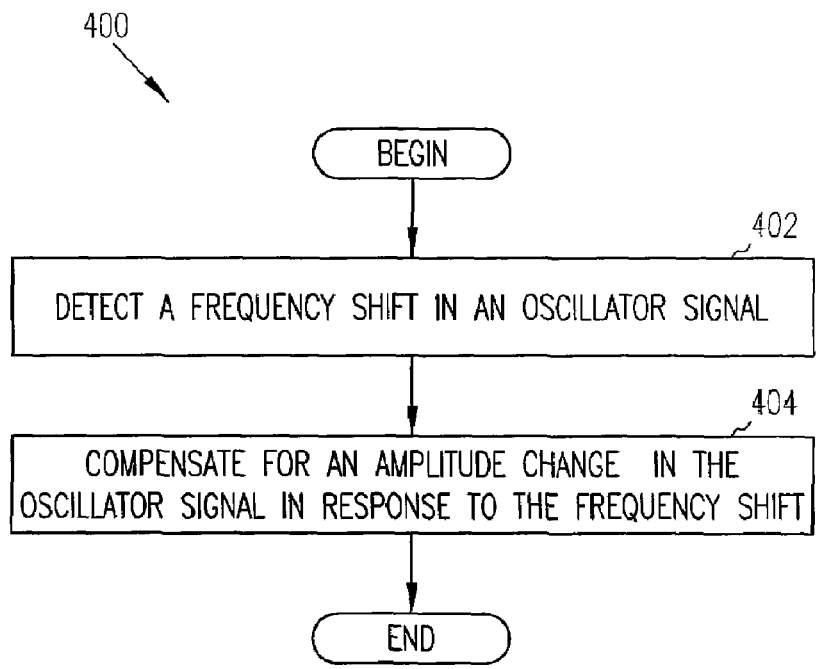
FIG. 4 illustrates a flow diagram of a method for compensating for noise in an oscillator signal in accordance with one embodiment.

FIG. 4 illustrates a flow diagram of a method 400 for compensating for noise in an oscillator signal in accordance with one embodiment. The method 400 includes detecting a frequency shift in an oscillator signal (block 402), and compensating for an amplitude change in the oscillator signal in response to the frequency shift (block 404). In another embodiment, detecting the frequency shift in the oscillator signal includes processing the oscillator signal with a high-pass filter. In still another embodiment, compensating for the amplitude change in the oscillator signal in response to the frequency shift comprises adjusting a gain control signal provided to a transconductance amplifier.

Figure 5:
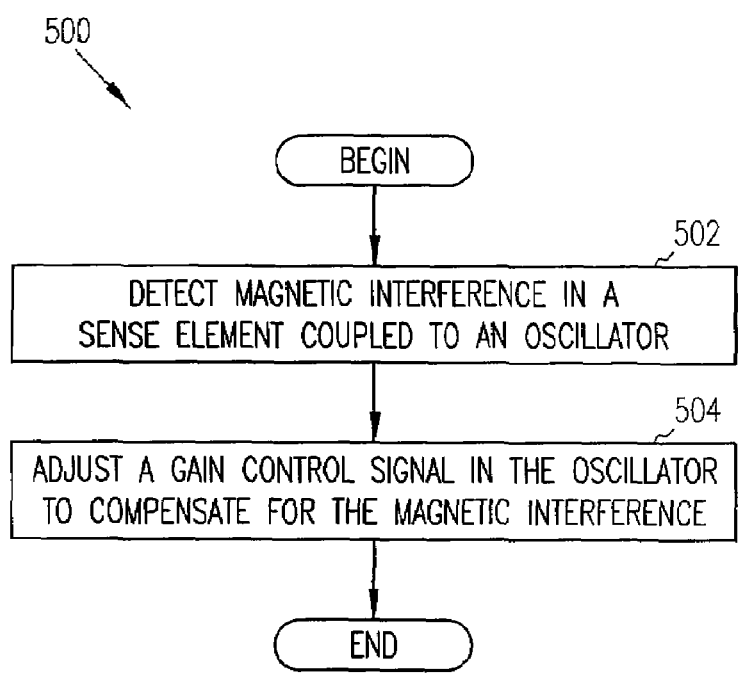
FIG. 5 illustrates a flow diagram of a method for compensating for magnetic interference in an oscillator signal in accordance with one embodiment.

FIG. 5 illustrates a flow diagram of a method 500 for compensating for magnetic interference in an oscillator signal in accordance with one embodiment. The method 500 includes detecting magnetic interference in a sense element coupled to an oscillator (block 502), and adjusting a gain control signal in the oscillator to compensate for the magnetic interference (block 504). In another embodiment, detecting magnetic interference in the sense element coupled to the oscillator includes detecting a frequency shift in an oscillator signal. In still another embodiment, adjusting the gain control signal in the oscillator to compensate for the magnetic interference comprises passing an oscillator signal through a filter to adjust the gain control signal.

Figure 6:
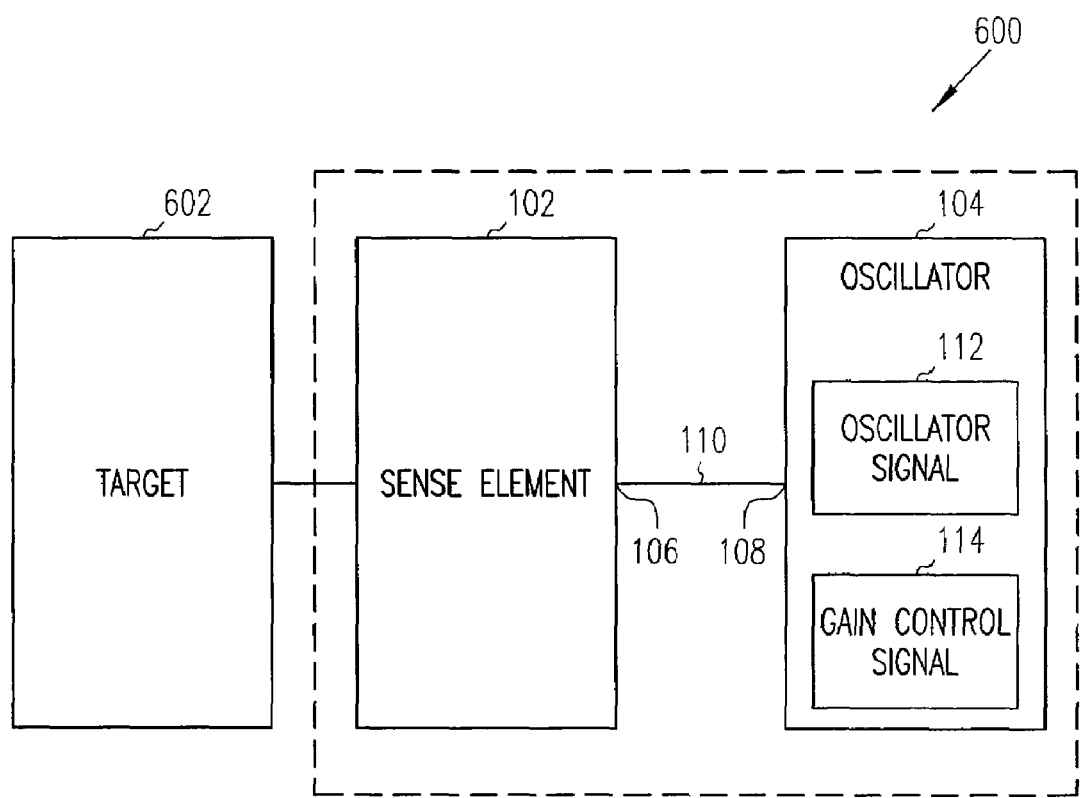
FIG. 6 illustrates block diagram of a system including the sense element, shown in FIG. 1A, the oscillator, shown in FIG. 1A, and a target in accordance with one embodiment.

FIG. 6 illustrates a block diagram of a system 600 including the sense element 102 and the oscillator 104, shown in FIG. 1A, and a target 602 in accordance with one embodiment. The sense element 102 includes the sense element port 106. The oscillator 104 includes the oscillator port 108. The channel 110 couples the sense element port 106 to the oscillator port 108.

The target 602 is not limited to a particular target. In some embodiments, the target 602 includes a moveable structure to be detected by the sense element 102. In some embodiments, the moveable structure includes a welding unit. In some embodiments, the target 602 includes a stationary structure to be detected by the sense element 102. Exemplary stationary structures includes tables and automobile bodies on an assembly line. In some embodiments, the stationary structure includes an arc welding unit.

In operation, the oscillator 104 generates the oscillator signal 112 and the gain control signal 114. The target 602 is detected by the sense element 102. The oscillator amplitude compensates the oscillator signal 112 when magnetic noise is detected in the sense element 102.

Figure 7:
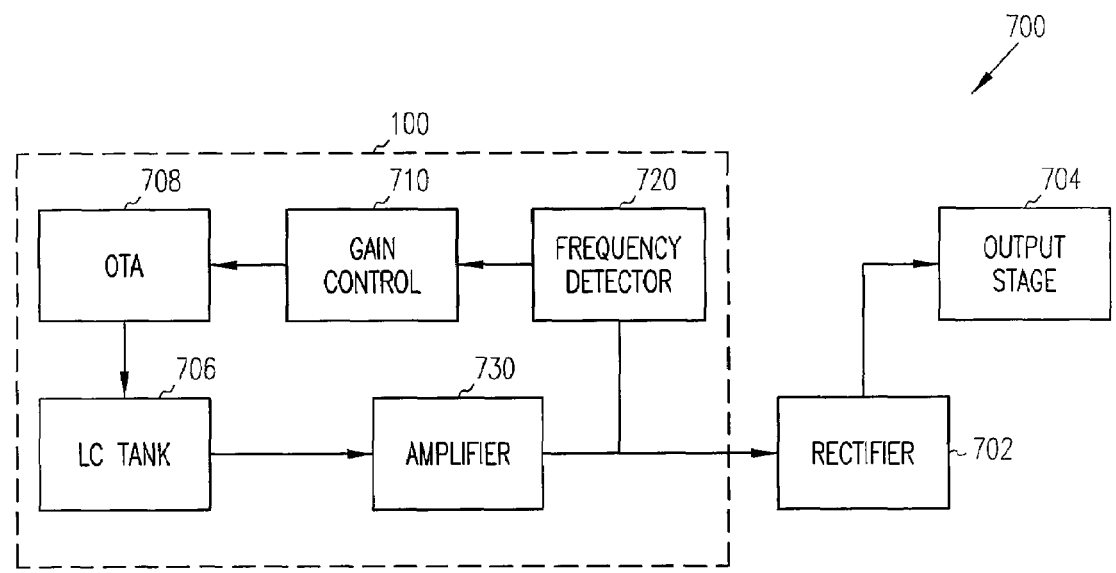
FIG. 7 illustrates a block diagram of an apparatus including the apparatus, shown in FIG. 1A, a rectifier and an output stage in accordance with one embodiment.

FIG. 7 illustrates a block diagram of an apparatus 700 including the apparatus 100, shown in FIG. 1A, a rectifier 702 and an output stage 704 in accordance with one embodiment. The apparatus 100 includes the LC Tank 706, an operational transconductance amplifier 708, a gain control 710, a frequency detector 720, and an amplifier 730. The LC Tank 706 is coupled to the operational transconductance amplifier 708 and the amplifier 730. The operational transconductance amplifier 708 is coupled to the gain control 710. The LC Tank 706 is coupled to the amplifier 730. The frequency detector 720 is coupled to the gain control 710, the amplifier 730 and the rectifier 702. The rectifier 702 is coupled to the output stage 704.

In operation, the operation transconductance amplifier 708 functions as a variable gain voltage controlled current source to drive the LC Tank 706. When the core of the LC Tank 706 is substantially saturated in a magnetic field, the oscillating frequency of the apparatus 100 increases. The change in the oscillating frequency is detected and converted into a gain change in the apparatus 100 to compensate the tank impedance change of the LC Tank 706 caused by the magnetic field.

Figure 8:
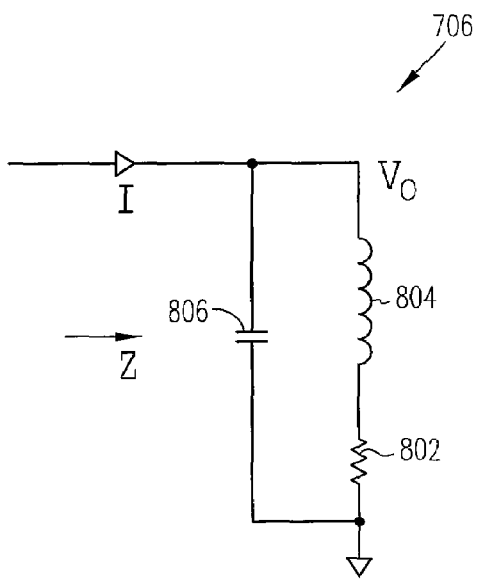
FIG. 8 illustrates a schematic diagram of the LC Tank, shown in FIG. 7, in accordance with one embodiment.

FIG. 8 illustrates a schematic diagram of the LC Tank 706, shown in FIG. 7, in accordance with one embodiment. The LC Tank 706 includes a resistor 802, an inductor 804, and a capacitor 806. The resistor 802 is in series with the inductor 804. The capacitor 806 is in parallel with the series combination of the resistor 802 and the inductor 804.

In operation, for the LC Tank included in the apparatus 700, shown in FIG. 7, when an external magnetic field saturates the core of the inductor 804, the permeability of the core drops and the coil inductance drops. As a result, the impedance Z of the tank circuit 800 decreases and the amplitude of the oscillator signal of the apparatus 100, shown in FIG. 8, decreases. Without compensation the apparatus 100 will change sensing distance and will falsely trigger if the external magnetic field is strong enough. At substantially the same time, the frequency of the oscillator signal of the apparatus 100 increases as a result of the coil inductance drop. This frequency shift is used to adjust the gain of the apparatus 100 to compensate the magnetic field effect (dropped amplitude of the oscillator signal).

Figure 9:
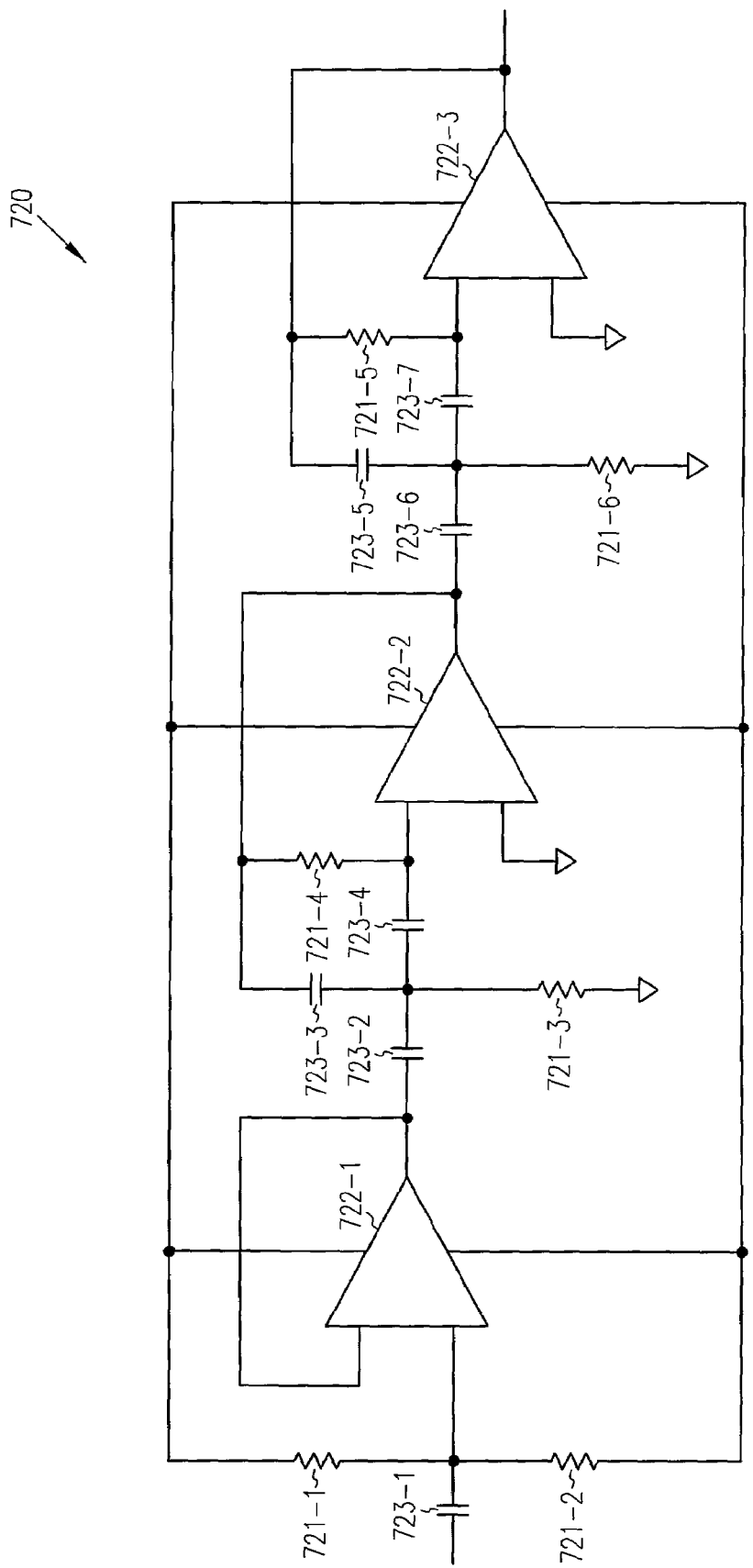
FIG. 9 illustrates a schematic diagram of the frequency detector, shown in FIG. 7, in accordance with one embodiment.

FIG. 9 illustrates a schematic diagram of the frequency detector 720, shown in FIG. 7, in accordance with one embodiment. The frequency detector 720 includes a highpass filer having active elements (722-1. 722-2, and 722-3) configured with passive resistors (721-1, 721- 2, 721-3, 721-4, 721-5, and 721-6) and capacitors (723-1, 723-2, 723-3, 723-4, 723-5, 723-6, and 723-7).

It is to be understood that the above description is intended to be illustrative, and not restrictive. Furthermore, it should be noted that the embodiments, and various options described above and illustrated in the drawings, may be selectively combined to form additional embodiments. Many other embodiments will be apparent to those of skill in the art upon reviewing the above description. The scope should, therefore, be determined with reference to the appended claims, along with the full scope of equivalents to which such claims are entitled.

What is claimed is:

1. An apparatus comprising:
   a sense element; and
   an oscillator coupled to the sense element, the oscillator to generate an oscillator signal and a gain control signal, the oscillator to amplitude compensate the oscillator signal by adjustment of the amplitude of the oscillator signal when magnetic noise is detected in the sense element.

2. The apparatus of claim 1, wherein the sense element includes a magnetic core in a LC tank.

3. The apparatus of claim 1, wherein the magnetic noise has a frequency of about sixty hertz.

4. The apparatus of claim 1, wherein the oscillator comprises a filter coupled to a transconductance amplifier.

5. The apparatus of claim 1, wherein the sense element comprises a coil including a magnetic core.

6. The apparatus of claim 5, wherein the magnetic core comprises a ferromagnetic material.

7. The apparatus of claim 1, wherein the oscillator includes a frequency detector structured to detect a frequency shift in the oscillator signal, the frequency shift associated with the magnetic noise.

8. The apparatus of claim 7, wherein the frequency detector includes a high pass filter having multiple stages, each stage having an active element coupled to a capacitor and to a passive resistor.

9. The apparatus of claim 1, wherein the detected magnetic noise is associated with saturation of magnetic material of the sensing element and a shift of frequency in the oscillating signal.

10. An apparatus comprising:
    a sense element; and
    an oscillator coupled to the sense element, the oscillator to generate an oscillator signal and a gain control signal, the oscillator comprising a filter coupled to a transconductance amplifier, wherein the filter receives the oscillator signal at a filter input port and provides the gain control signal at a filter output port.

11. The apparatus of claim 10, wherein the filter comprises a highpass filter.

12. The apparatus of claim 11 wherein the highpass filter has a cutoff frequency and the oscillator signal has a frequency below the cutoff frequency.

13. The apparatus of claim 12, wherein the transconductance amplifier includes a gain input port and the filter output port is coupled to the gain input port.

14. A system comprising:

a sense element;

an oscillator coupled to the sense element, the oscillator to generate an oscillator signal and a gain control signal, the oscillator to amplitude compensate the oscillator signal by adjustment of the amplitude of the oscillator signal when magnetic noise is detected in the sense element; and a target to be detected by the sense element.

15. The system of claim 14, wherein the target comprises a moveable structure to be detected by the sense element.

16. The system of claim 15, wherein the moveable structure includes a welding unit.

17. The system of claim 14, wherein the target comprises a stationary structure to be detected by the sense element.

18. The system of claim 17, wherein the stationary structure comprises an arc welding unit.

19. The system of claim 14, wherein the oscillator includes a frequency detector structured to detect a frequency shift in the oscillator signal, the frequency shift associated with the magnetic noise.

20. The system of claim 19, wherein the frequency detector includes a high pass filter having multiple stages, each stage having an active element coupled to a capacitor and a passive resistor.

21. The system of claim 14, wherein the detected magnetic noise is associated with saturation of magnetic material of the sensing element and a shift of frequency in the oscillating signal.

* * * * *